(12) United States Patent
Park et al.

(10) Patent No.: US 11,114,634 B2
(45) Date of Patent: Sep. 7, 2021

(54) PHOTODIODE

(71) Applicant: Samsung Electronics Co., Ltd., Suwon-si (KR)

(72) Inventors: Kyung Bae Park, Hwaseong-si (KR); Kyu Sik Kim, Yongin-si (KR); Yong Wan Jin, Seoul (KR); Kwang Hee Lee, Hwaseong-si (KR); Dong-Seok Leem, Hwaseong-si (KR); Seon-Jeong Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 135 days.

(21) Appl. No.: 16/031,412

(22) Filed: Jul. 10, 2018

(65) Prior Publication Data

US 2018/0323389 A1    Nov. 8, 2018

Related U.S. Application Data

(63) Continuation of application No. 13/354,980, filed on Jan. 20, 2012, now Pat. No. 10,043,992.

(30) Foreign Application Priority Data

Sep. 9, 2011    (KR) ......................... 10-2011-0092085

(51) Int. Cl.
   *H01L 51/42*    (2006.01)
(52) U.S. Cl.
   CPC ........ *H01L 51/4253* (2013.01); *H01L 51/426* (2013.01); *Y02E 10/549* (2013.01)

(58) Field of Classification Search
   CPC .. H01L 51/4253; H01L 51/426; Y02E 10/549
   See application file for complete search history.

(56) References Cited

U.S. PATENT DOCUMENTS

| 6,175,142 | B1 | 1/2001 | Ehara |
| 7,663,685 | B2 | 2/2010 | Inuiya |
| 7,816,713 | B2 * | 10/2010 | Kim ................. H01L 27/14647 257/290 |
| 8,216,699 | B2 | 7/2012 | Burn et al. |

(Continued)

FOREIGN PATENT DOCUMENTS

| CN | 101248542 A | 8/2008 |
| CN | 102947967 A | 2/2013 |

(Continued)

OTHER PUBLICATIONS

Chinese Office Action dated Jan. 26, 2016 issued in corresponding Chinese Patent Application No. 201210103761.0.

(Continued)

*Primary Examiner* — Benjamin Tzu-Hung Liu
(74) *Attorney, Agent, or Firm* — Harness, Dickey & Pierce, P.L.C.

(57) ABSTRACT

A photodiode according to example embodiments includes an anode, a cathode, and an intrinsic layer between the anode and the cathode. The intrinsic layer includes a P-type semiconductor and an N-type semiconductor, and composition ratios of the P-type semiconductor and the N-type semiconductor vary within the intrinsic layer depending on a distance of the intrinsic layer from one of the anode and the cathode.

6 Claims, 11 Drawing Sheets

(56) References Cited

U.S. PATENT DOCUMENTS

| | | | |
|---|---|---|---|
| 8,218,899 B2* | 7/2012 | Yamazaki | G06K 9/00228 382/276 |
| 2005/0072971 A1 | 4/2005 | Marrocco et al. | |
| 2006/0254639 A1 | 11/2006 | Idota | |
| 2007/0235727 A1* | 10/2007 | Setayesh | H01L 51/0026 257/40 |
| 2008/0163927 A1 | 7/2008 | Sohn et al. | |
| 2008/0179702 A1 | 7/2008 | Nasuno et al. | |
| 2008/0246853 A1 | 10/2008 | Takizawa et al. | |
| 2009/0107539 A1 | 4/2009 | Musha et al. | |
| 2010/0207114 A1* | 8/2010 | Koenemann | H01L 51/0078 257/40 |
| 2010/0294351 A1 | 11/2010 | Holmes et al. | |
| 2010/0326525 A1 | 12/2010 | Nguyen et al. | |
| 2011/0036406 A1* | 2/2011 | Okubo | B82Y 10/00 136/263 |
| 2011/0100465 A1* | 5/2011 | Horng | H01L 51/4253 136/263 |
| 2012/0068123 A1* | 3/2012 | Sundarraj | H01L 51/0078 252/506 |
| 2013/0025685 A1 | 1/2013 | Berson et al. | |

FOREIGN PATENT DOCUMENTS

| | | | |
|---|---|---|---|
| JP | 10-190037 A | | 7/1998 |
| JP | 2002-217474 A | | 8/2002 |
| JP | 2006-73856 A | | 3/2006 |
| JP | 2006-237351 A | | 9/2006 |
| JP | 2008-186953 A | | 8/2008 |
| JP | WO2010/038721 | * | 4/2010 |
| JP | WO2010038721 | * | 4/2010 |
| JP | 2010-278155 A | | 12/2010 |
| JP | 2011-23580 A | | 2/2011 |
| JP | 2011-023594 | | 2/2011 |
| JP | 2011-54869 A | | 3/2011 |
| JP | 2013-062503 | | 4/2013 |
| KR | 2007-0108040 A | | 11/2007 |
| WO | WO-2005/034199 A2 | | 4/2005 |
| WO | WO-2007/062072 A1 | | 5/2007 |
| WO | WO-2010/038721 A1 | | 4/2010 |
| WO | WO-20101095517 A1 | | 8/2010 |

OTHER PUBLICATIONS

Japanese Office Action dated May 31, 2016 issued in corresponding Japanese Patent Application No. 2012-197654 (English translation provided).

Japanese Office Action dated May 29, 2018 issued in corresponding Japanese Patent Application No. 2017-137849 (English translation provided).

European Search Report dated Nov. 30, 2012, issued in European Application No. 12157428.9.

* cited by examiner

PHOTODIODE

CROSS REFERENCE TO RELATED APPLICATIONS

This application is a Continuation of U.S. application Ser. No. 13/354,980 filed on Jan. 20, 2012, which claims priority to and the benefit of Korean Patent Application No. 10-2011-0092085 filed in the Korean Intellectual Property Office on Sep. 9, 2011, the entire contents of each of which are incorporated herein by reference.

BACKGROUND

1. Field

Example embodiments relate to a photodiode including an organic semiconductor.

2. Description of the Related Art

The resolution of an image sensor including a photodiode becomes higher, and thus, the size of a pixel becomes decreased. The reduction of the pixel size may cause the decrease of the absorption area that in turn reduces the sensitivity of a silicon photodiode.

Therefore, organic semiconductors having a higher extinction coefficient and higher wavelength selectivity compared with silicon are being considered as photoelectric materials of a photodiode.

A photodiode including an organic semiconductor as a photoelectric material generally has a triple-layered structure that includes a P-type semiconductor, an intrinsic layer, and an N-type semiconductor. The intrinsic layer is formed by co-depositing a P-type semiconductor and an N-type semiconductor. The intrinsic layer absorbs light to produce excitons, and the excitons are divided into holes and electrons at a joint surface of the N-type semiconductor and the P-type semiconductor. The holes and electrons move to electrodes to generate current. However, the external quantum efficiency and the light responsivity of the above-described photodiode may not be desirable.

SUMMARY

According to example embodiments, a photodiode may include an anode, a cathode, and an intrinsic layer between the anode and the cathode. The intrinsic layer may include a P-type semiconductor and an N-type semiconductor. Composition ratios of the P-type semiconductor and the N-type semiconductor may vary within the intrinsic layer depending on a position.

Composition ratios of the P-type semiconductor and the N-type semiconductor may vary within the intrinsic layer depending on a distance of the intrinsic layer from one of the anode and the cathode.

A composition ratio of the P-type semiconductor in the intrinsic layer may increase closer to the anode, and a composition ratio of the N-type semiconductor in the intrinsic layer may increase closer to the cathode. A variation of the composition ratios of the P-type semiconductor and the N-type semiconductor in the intrinsic layer may be continuous in a direction from the anode to the cathode.

The intrinsic layer may include at least two sublayers deposited in sequence, the at least two sublayers having different composition ratios. The at least two sublayers may include a first sublayer closest to the anode, the first sublayer having a greater composition ratio of the P-type semiconductor than the composition ratio of the N-type semiconductor, and a second sublayer closest to the cathode, the second sublayer having a greater composition ratio of the N-type semiconductor than the composition ratio of the P-type semiconductor.

A composition ratio of the P-type semiconductor in the at least two sublayers may increase closer to the anode, and a composition ratio of the N-type semiconductor in the at least two sublayers may increase closer to the cathode. The composition ratio of the P-type semiconductor relative to the N-type semiconductor in the first sublayer may be greater than about 1 and smaller than about 1,000, and the composition ratio of the P-type semiconductor relative to the N-type semiconductor in the second sublayer may be smaller than about 1 and greater than about $1/1,000$.

The at least two sublayers may further include a third sublayer between the first sublayer and the second sublayer. A composition ratio of the P-type semiconductor relative to the N-type semiconductor may be about 10 in the first sublayer, about $1/10$ in the second sublayer, and about 5 in the third sublayer.

Each of the at least two sublayers may have a thickness of about 1 nm to about 100 nm. The P-type semiconductor of the intrinsic layer may include N,N'-dimethyl quinacridone (DMQA), and the N-type semiconductor of the intrinsic layer may include at least one of C60, C70, and [6,6]-phenyl-C61-butyric acid methyl ester (PCBM). The N-type semiconductor of the intrinsic layer may include 060. The photodiode may further include an N-type semiconductor layer between the intrinsic layer and the cathode, the N-type semiconductor layer substantially not including a P-type semiconductor.

The photodiode may further include an electron blocking layer between the intrinsic layer and the anode, the electron blocking layer including at least one of poly(3,4-ethylene-dioxythiophene)poly(styrenesulfonate) (PEDOT:PSS), 4,4', 4"-tris(N-(2-naphthyl)-N-phenyl-amino)-triphenylamine (2TNATA), a molybdenum oxide, and a zinc oxide.

The photodiode may further include a P-type semiconductor layer between the intrinsic layer and the anode, the P-type semiconductor layer not including an N-type semiconductor.

The photodiode may further include a hole blocking layer between the intrinsic layer and the cathode, the hole blocking layer including at least one of 4,7-diphenyl-1,10-phenanthroline (Bphen), Benocyclidine (BCP), and 1,3,5-tris(1-phenyl-1H-benzimidazol-2-yl)benzene (TPBI).

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
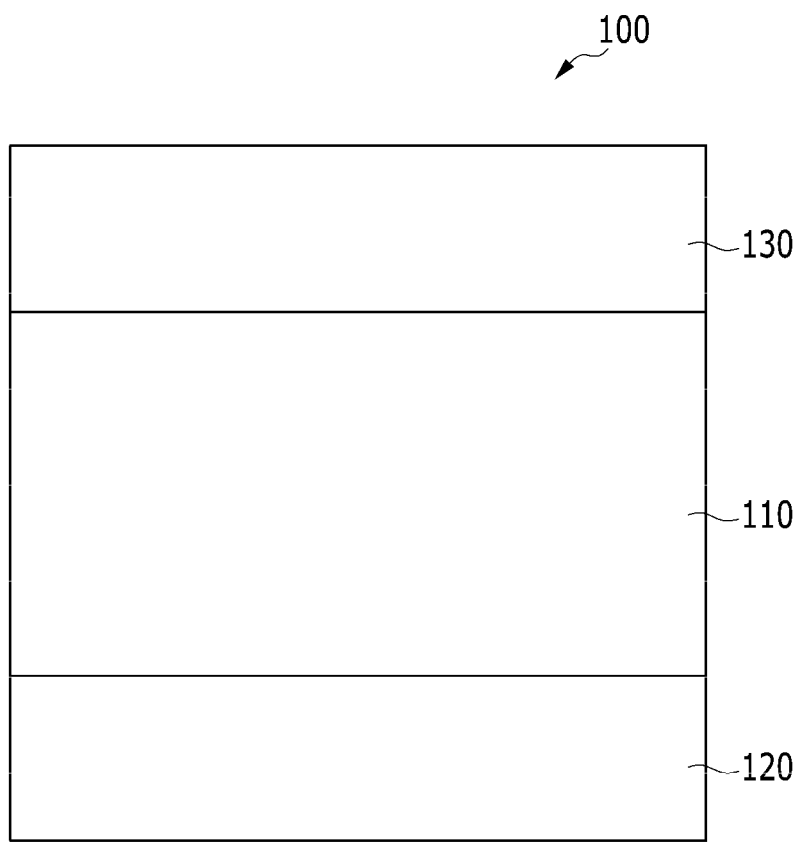
FIGS. 1-7 are schematic sectional views of photodiodes according to example embodiments.

Example embodiments will be described more fully hereinafter with reference to the accompanying drawings. As those skilled in the art would realize, the described embodiments may be modified in various different ways, all without departing from the spirit or scope. In the drawing, parts having no relationship with the explanation are omitted for clarity, and the same or similar reference numerals designate the same or similar elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Photodiodes according to example embodiments are described in detail with reference to the drawings. In this regard, example embodiments may have different forms and should not be construed as being limited to the descriptions set forth herein. Accordingly, example embodiments are merely described below, by referring to the figures, to explain aspects of the present description.

Figure 2:
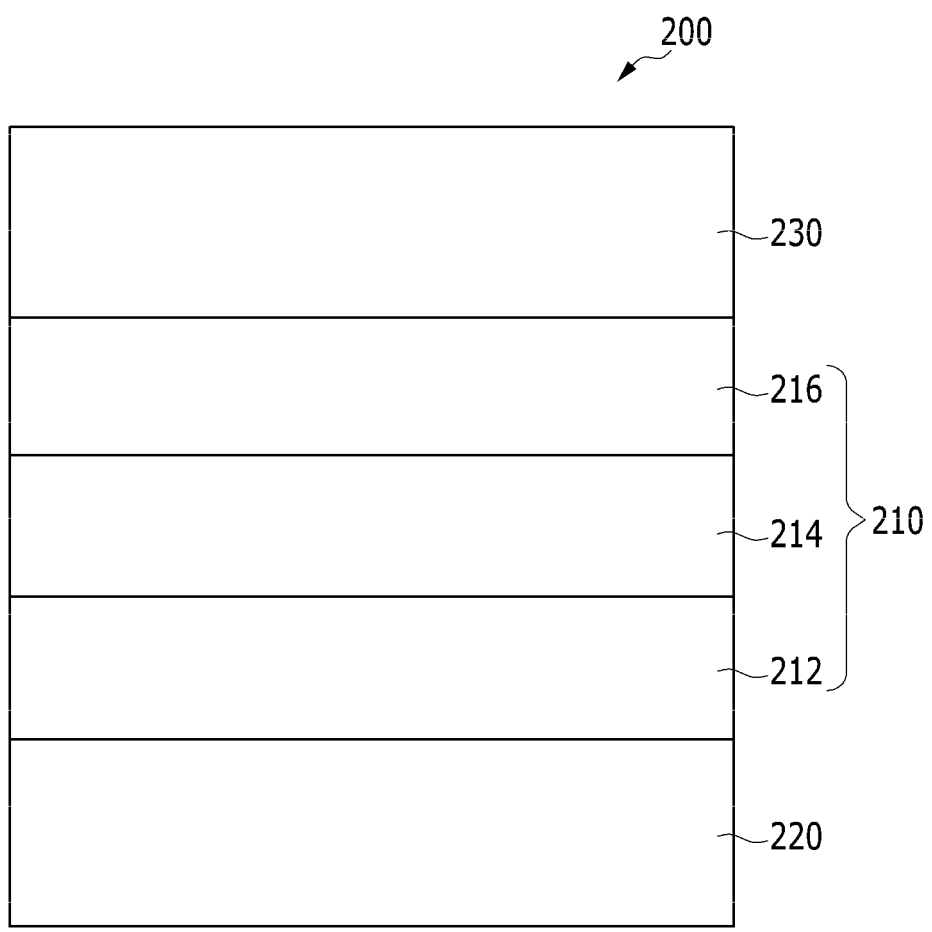

FIG. 1 and FIG. 2 are schematic sectional views of photodiodes according to example embodiments. Referring to FIG. 1, a photodiode 100 according to example embodiments includes an intrinsic layer 110, and an anode 120 and a cathode 130 disposed on opposite sides of the intrinsic layer 110. Although FIG. 1 shows that the anode 120 is disposed under the intrinsic layer 110 and the cathode 130 is disposed on the intrinsic layer 110, the cathode 130 may be disposed under the intrinsic layer 110 and the anode 120 may be disposed on the intrinsic layer 110.

The intrinsic layer 110 includes both a P-type semiconductor and an N-type semiconductor, and the composition ratio of the P-type semiconductor and the N-type semiconductor may vary depending on the position of the intrinsic layer 110. For example, the composition ratio of the P-type semiconductor may be greater than that of the N-type semiconductor at a position closer to the anode 120, while the composition ratio of the N-type semiconductor may be greater than that of the P-type semiconductor at a position closer to the cathode 130. In addition, the composition ratios of the P-type semiconductor and the N-type semiconductor may be different at different positions, the distances from which to the anode 120 are substantially equal to each other, for example, at different positions that have substantially the same height in FIG. 1.

In the intrinsic layer 110, the composition ratios of the P-type semiconductor and the N-type semiconductor may vary continuously. For example, the composition ratios of the P-type semiconductor and the N-type semiconductor in the intrinsic layer 110 may vary gradually from about 1000:1 to about 1:1000 from the anode 120 to the cathode 130. However, the composition ratios of the P-type semiconductor and the N-type semiconductor are not limited thereto.

The composition ratios of the P-type semiconductor and the N-type semiconductor in the intrinsic layer 110 may change stepwise. In example embodiments, the intrinsic layer 110 may include two or more sublayers having different composition ratios, and a sublayer closer to the anode 120 may have a higher concentration of the P-type semiconductor and a lower concentration of the N-type semiconductor, while another sublayer closer to the cathode 130 may have a lower concentration of the P-type semiconductor and a higher concentration of the N-type semiconductor.

For example, the P-type semiconductor may include N,N'-dimethyl quinacridone (DMQA), and the N-type semiconductor may include at least one of C60, C70, and [6,6]-phenyl-C61-butyric acid methyl ester (PCBM). However, a variety of other semiconductive materials may also be used.

The intrinsic layer 110 may be formed by co-depositing the P-type semiconductor and the N-type semiconductor by means of thermal evaporation. However, the deposition method may not be limited thereto.

The anode 120 may include a transparent conductive material, e.g., indium-tin-oxide (ITO) and indium-zinc-oxide (IZO), so that light may pass therethrough, but the material for the anode 120 may not be limited thereto. The cathode 130 may include a metal, e.g., Al, but the material for the cathode 130 may not be limited thereto.

The anode 120 may be formed by sputtering, and the cathode 130 may be formed by thermal evaporation. However, the deposition methods for the anode 120 and the cathode 130 may not be limited thereto.

Referring to FIG. 2, a photodiode 200 according to example embodiments includes an anode 220, a cathode 230, and an intrinsic layer 210 disposed between the anode 220 and the cathode 230. The intrinsic layer 210 may include three sublayers 212, 214, and 216.

Each of the sublayers 212, 214, and 216 includes a P-type semiconductor and an N-type semiconductor. The composition ratios of the P-type semiconductor and the N-type semiconductor may be different in the sublayers 212, 214, and 216. The composition ratio of the P-type semiconductor may increase, and the composition ratio of the N-type semiconductor may decrease from the anode 220 to the cathode 230. For example, the composition ratio of the P-type semiconductor may be the greatest at the sublayer 212 that is closest to the anode 220, the smallest at the sublayer 216 that is closest to the cathode 230, and intermediate at the intermediate sublayer 214. Contrary to the P-type semiconductor, the composition ratio of the N-type semiconductor may be the greatest at the sublayer 216 that is closest to the cathode 230, the smallest at the sublayer 212 that is closest to the anode 220, and intermediate at the intermediate sublayer 214.

Furthermore, the composition ratio of the P-type semiconductor may be greater than that of the N-type semiconductor in the sublayer 212 that is close to the anode 220, and the composition ratio of the N-type semiconductor may be greater than that of the P-type semiconductor in the sublayer 216 that is close to the cathode 230. The composition ratio of the P-type semiconductor may be equal to or greater than the N-type semiconductor in the intermediate sublayer 214, or vice versa.

The composition ratio of the P-type semiconductor (CRP) relative to that of the N-type semiconductor (CRN), that is, CRP/CRN in the sublayer 212 that is closer to the anode 220 may be greater than about one and smaller than about 1,000, while the CRP/CRN may be smaller than about one and greater than about $1/1,000$ in the sublayer 216 that is closer to the cathode 230.

In each of the sublayers 212, 214, and 216, the composition ratios of the P-type semiconductor and the N-type semiconductor may vary depending on the position or the height. The thickness of each sublayer 212, 214, or 216 may be from about 1 nm to about 100 nm. The materials and forming methods of the layers shown in FIG. 2 may be substantially the same as those in FIG. 1. Although the number of the sublayers 212, 214, 216 shown in FIG. 2 is three, the number may be equal to two, four or more.

Incident light may enter from the transparent anode 120 or 220 of the photodiode shown in FIG. 1 or FIG. 2, and the intrinsic layer 110 or 210 may absorb a light with a predetermined or given wavelength to produce excitons therein. The excitons may be divided into holes and electrons at the joint surface between the N-type semiconductor and the P-type semiconductor in the intrinsic layer 110 or 210. The holes may move toward the anode 120 or 220, while the electrons may move toward the cathode 130 or 230 so that the current may be generated in the photodiode 100 or 200.

The higher concentration of the P-type semiconductor in the intrinsic layer 110 or 210 at a portion near the anode 120 or 220 may facilitate the holes generated at the portion to escape to the nearby anode 120 or 220. Similarly, the electrons generated at a portion that is close to the cathode 130 or 230 may easily escape to the cathode 130 or 230 because the composition ratio of the N-type semiconductor at the portion is higher. Therefore, the response time of the photodiode 100 or 200 for the incident light may be shortened.

Figure 3:
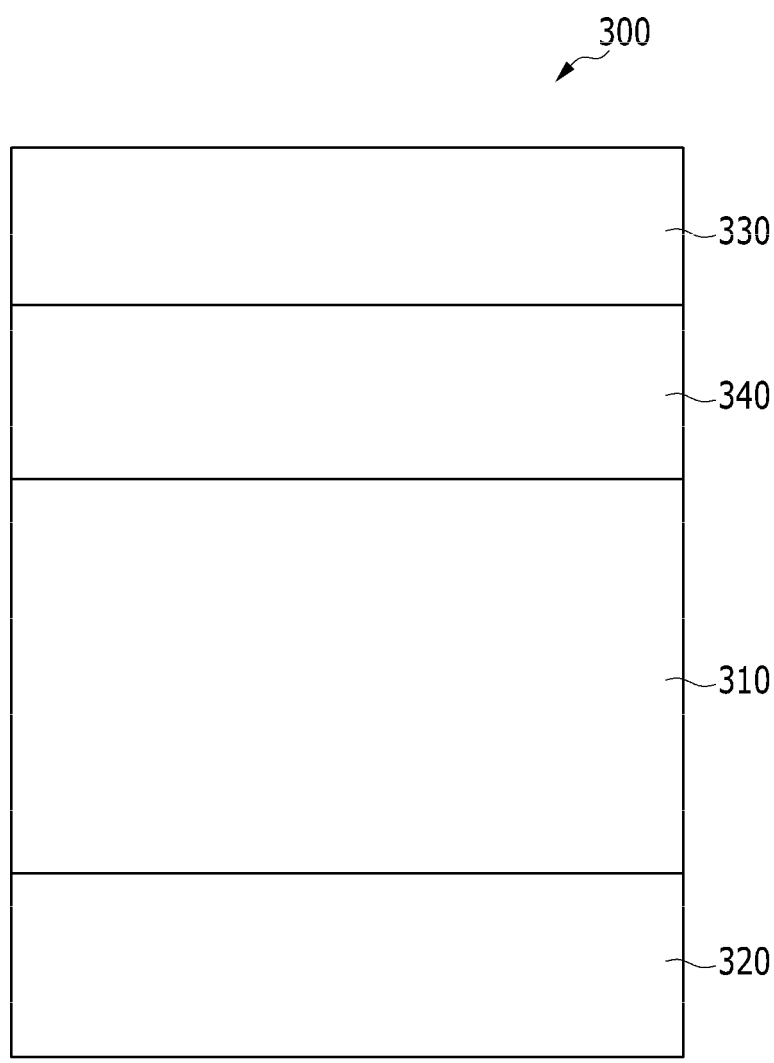

FIG. 3 to FIG. 7 are schematic sectional views of photodiodes according to example embodiments. Referring to FIG. 3, a photodiode 300 according to example embodiments includes an intrinsic layer 310, an anode 320 and a cathode 330 that are disposed on opposite sides of the intrinsic layer 310, and an N-type layer 340 disposed between the intrinsic layer 310 and the cathode 330. The intrinsic layer 310, the anode 320, and the cathode 330 may be substantially the same as those shown in FIG. 1 or FIG. 2.

The N-type layer 340 includes an N-type semiconductor but not a P-type semiconductor, and the N-type semiconductor in the N-type layer 340 may be the same as that in the intrinsic layer 310. The N-type layer, for example, C60 having higher electron mobility, may contribute to the relatively smooth performance of the photodiode 300 without a P-type layer (not shown) that has lower mobility.

Figure 4:
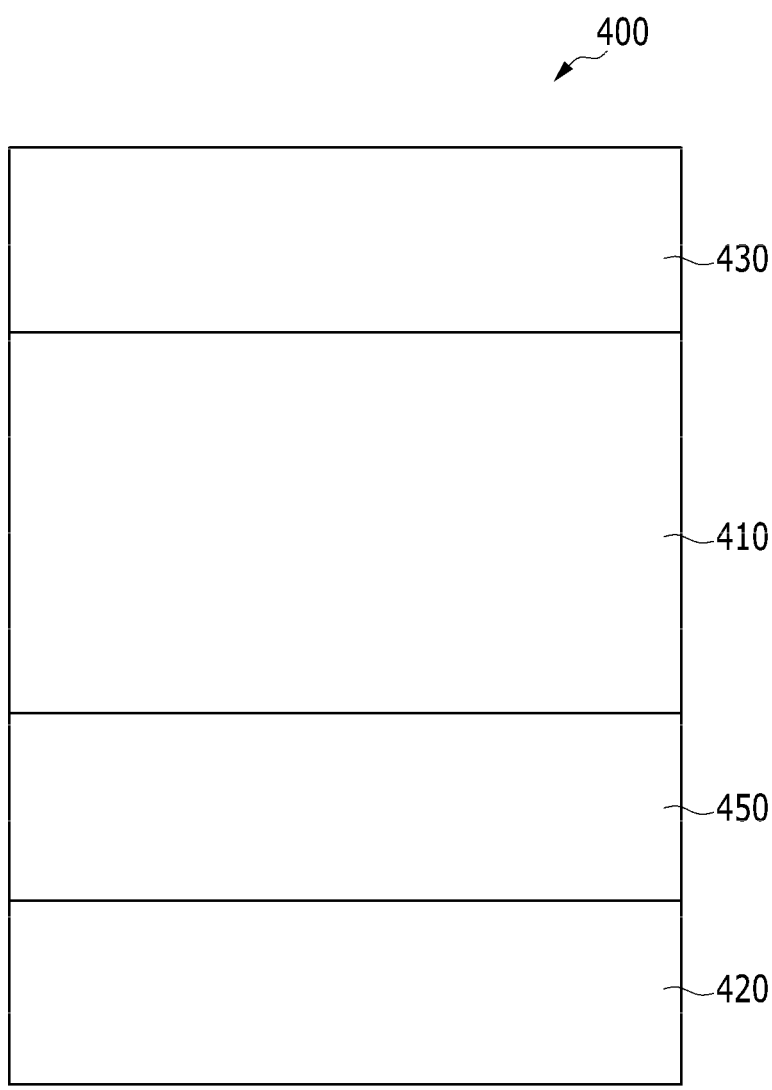

Referring to FIG. 4, a photodiode 400 according to example embodiments includes an intrinsic layer 410, an anode 420 and a cathode 430 that are disposed on opposite sides of the intrinsic layer 410, and a P-type layer 450 disposed between the intrinsic layer 410 and the anode 420. The intrinsic layer 410, the anode 420, and the cathode 430 may be substantially the same as those shown in FIG. 1 or FIG. 2.

The P-type layer 450 includes a P-type semiconductor but not an N-type layer, and the P-type semiconductor in the P-type layer 450 may be the same as the P-type semiconductor in the intrinsic layer 410.

Figure 5:
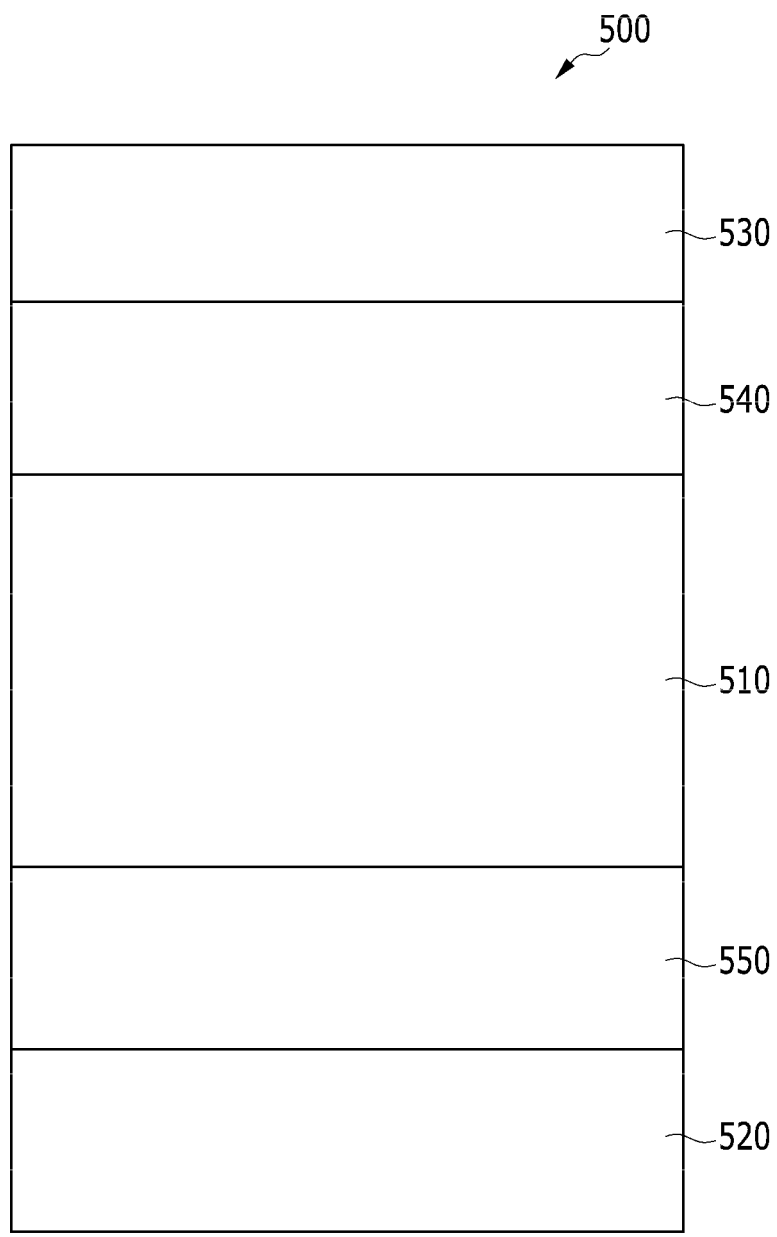

Referring to FIG. 5, a photodiode 500 according to example embodiments includes an intrinsic layer 510, an anode 520 and a cathode 530 that are disposed on opposite sides of the intrinsic layer 510, an N-type layer 540 disposed between the intrinsic layer 510 and the cathode 530, and a P-type layer 550 disposed between the intrinsic layer 510 and the anode 520. The intrinsic layer 510, the anode 520, and the cathode 530 may be substantially the same as those shown in FIG. 1 or FIG. 2.

The N-type layer 540 includes an N-type semiconductor but not a P-type semiconductor, and the N-type semiconductor in the N-type layer 540 may be the same as that in the intrinsic layer 510. The P-type layer 550 includes a P-type semiconductor but not an N-type layer, and the P-type semiconductor in the P-type layer 550 may be the same as the P-type semiconductor in the intrinsic layer 510.

Figure 6:
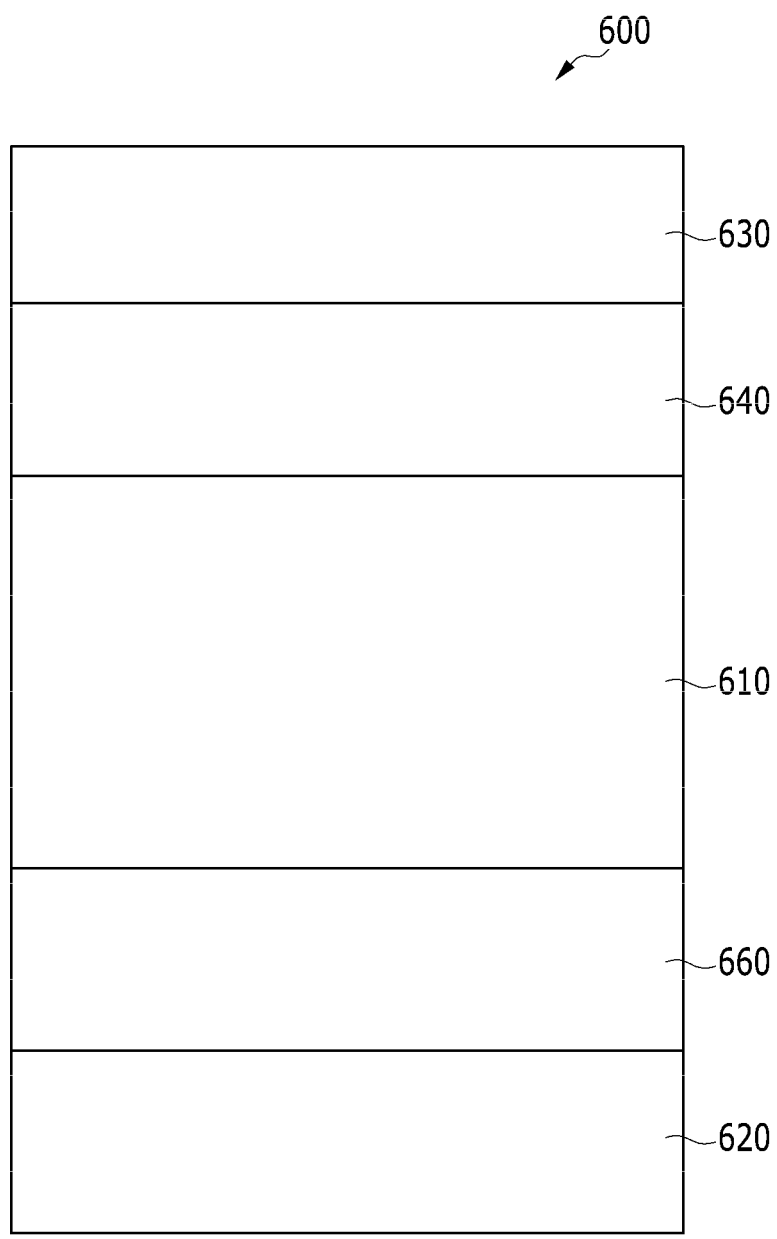

Referring to FIG. 6, a photodiode 600 according to example embodiments includes an intrinsic layer 610, an anode 620 and a cathode 630 that are disposed on opposite sides of the intrinsic layer 610, an N-type layer 640 disposed between the intrinsic layer 610 and the cathode 630, and an electron blocking layer 660 disposed between the intrinsic layer 610 and the anode 620. The intrinsic layer 610, the anode 620, and the cathode 630 may be substantially the same as those shown in FIG. 1 or FIG. 2, and the N-type layer 640 may be substantially the same as that shown in FIG. 3.

The electron blocking layer 660 may be referred to as the hole transport layer, and may block electrons from moving from the anode 620 to the intrinsic layer 610, thereby accelerating the light absorbance of the intrinsic layer 610 to increase the production of excitons. The electron blocking layer 660 may include at least one of organic materials, e.g., poly(3,4-ethylenedioxythiophene) poly(styrenesulfonate) (PEDOT:PSS), 4,4',4"-tris(N-(2-naphthyl)-N-phenyl-amino)-triphenylamine (2TNATA), and inorganic materials, e.g., molybdenum oxides and zinc oxides. The N-type layer 640 may be removed.

Figure 7:
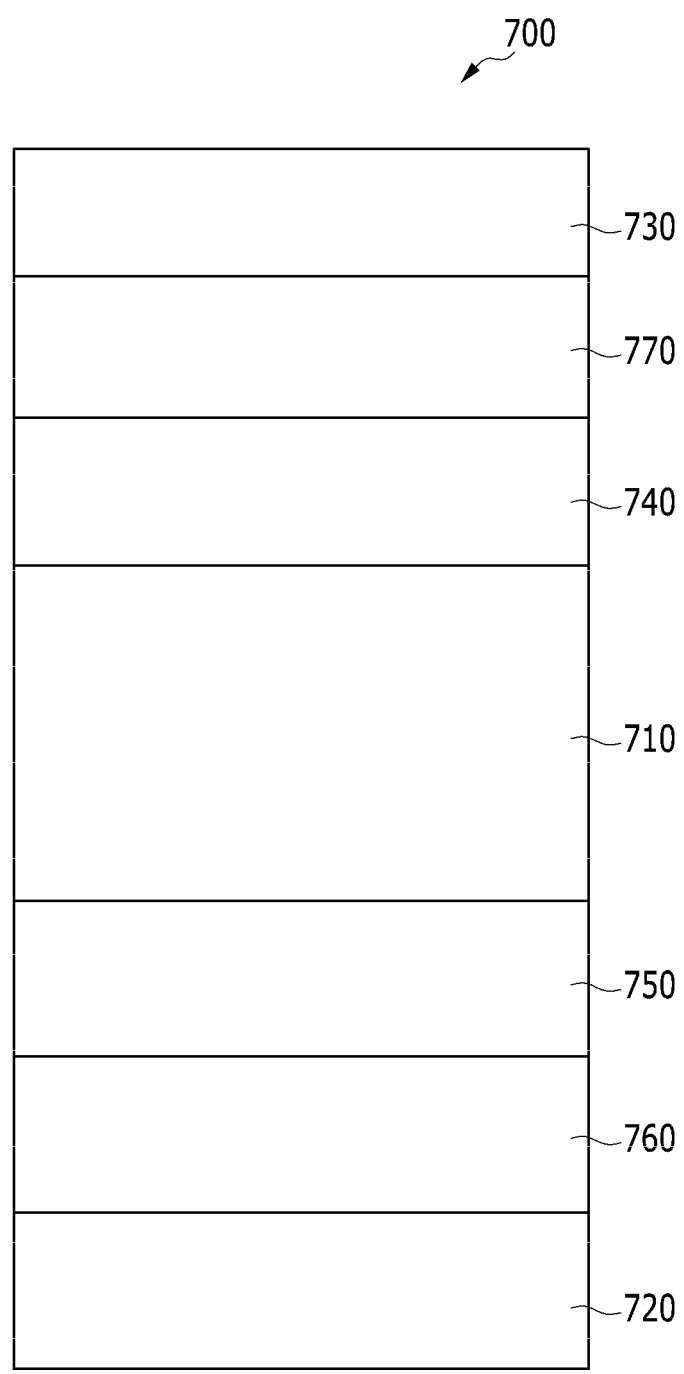

Referring to FIG. 7, a photodiode 700 according to example embodiments includes an intrinsic layer 710, an anode 720 and a cathode 730 that are disposed on opposite sides of the intrinsic layer 710, an N-type layer 740 and a hole blocking layer 770 that are disposed in sequence between the intrinsic layer 710 and the cathode 730, and a P-type layer 750 and an electron blocking layer 760 that are disposed in sequence between the intrinsic layer 710 and the anode 720. The intrinsic layer 710, the anode 720, and the cathode 730 may be substantially the same as those shown in FIG. 1 or FIG. 2, the N-type layer 740 may be substantially the same as that shown in FIG. 3, the P-type layer 750 may be substantially the same as that shown in FIG. 4, and the electron blocking layer 760 may be substantially the same as that shown in FIG. 6.

The hole blocking layer 770 may be referred to as the electron transport layer, and may block holes from moving from the cathode 730 to the intrinsic layer 710, thereby enhancing the light absorbance of the intrinsic layer 710 to produce more excitons. The hole blocking layer 770 may include at least one of 4,7-diphenyl-1,10-phenanthroline (Bphen), Benocyclidine (BCP), and 1,3,5-tris(1-phenyl-1H-benzimidazol-2-yl)benzene (TPBI). At least one of the N-type layer 740, the P-type layer 750, and the electron blocking layer 760 may be abbreviated.

Figure 8:
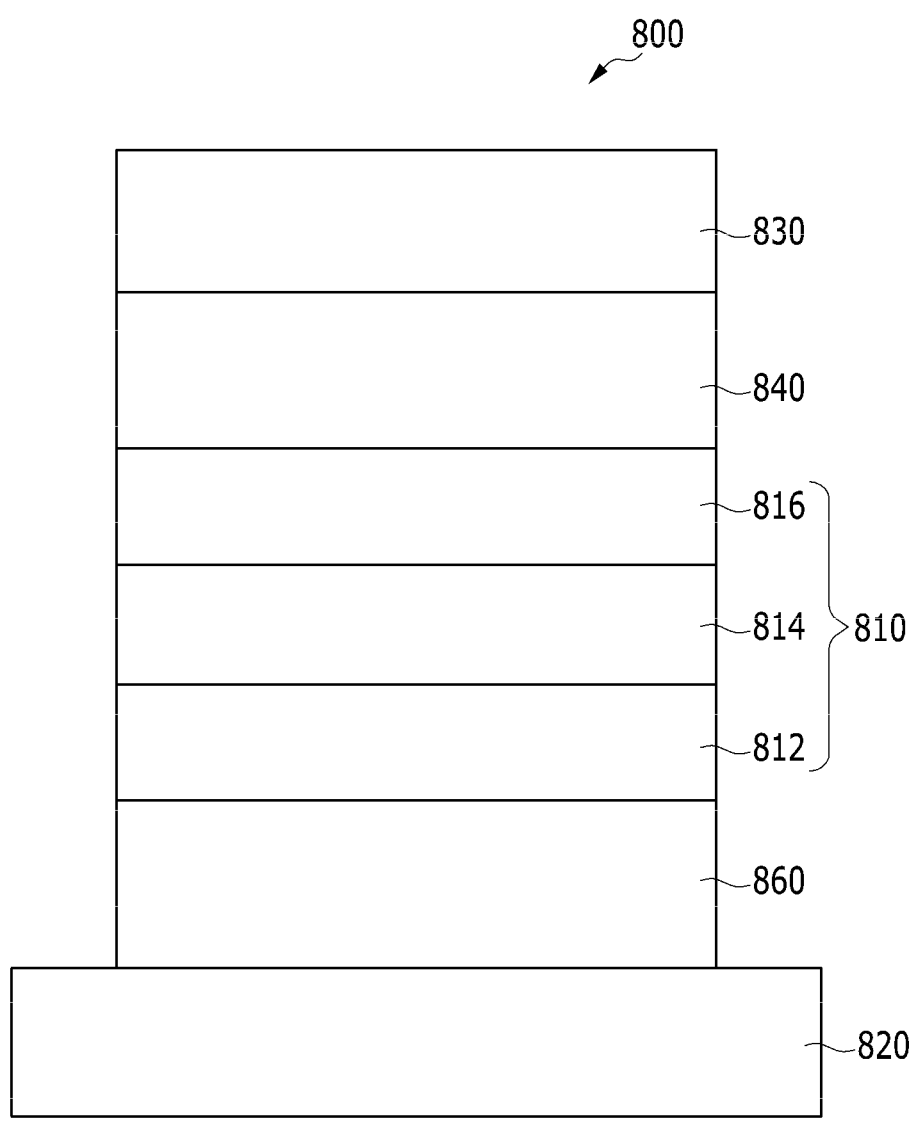
FIG. 8 is a schematic sectional view of an experimental example of a photodiode according to example embodiments.
Figure 10:
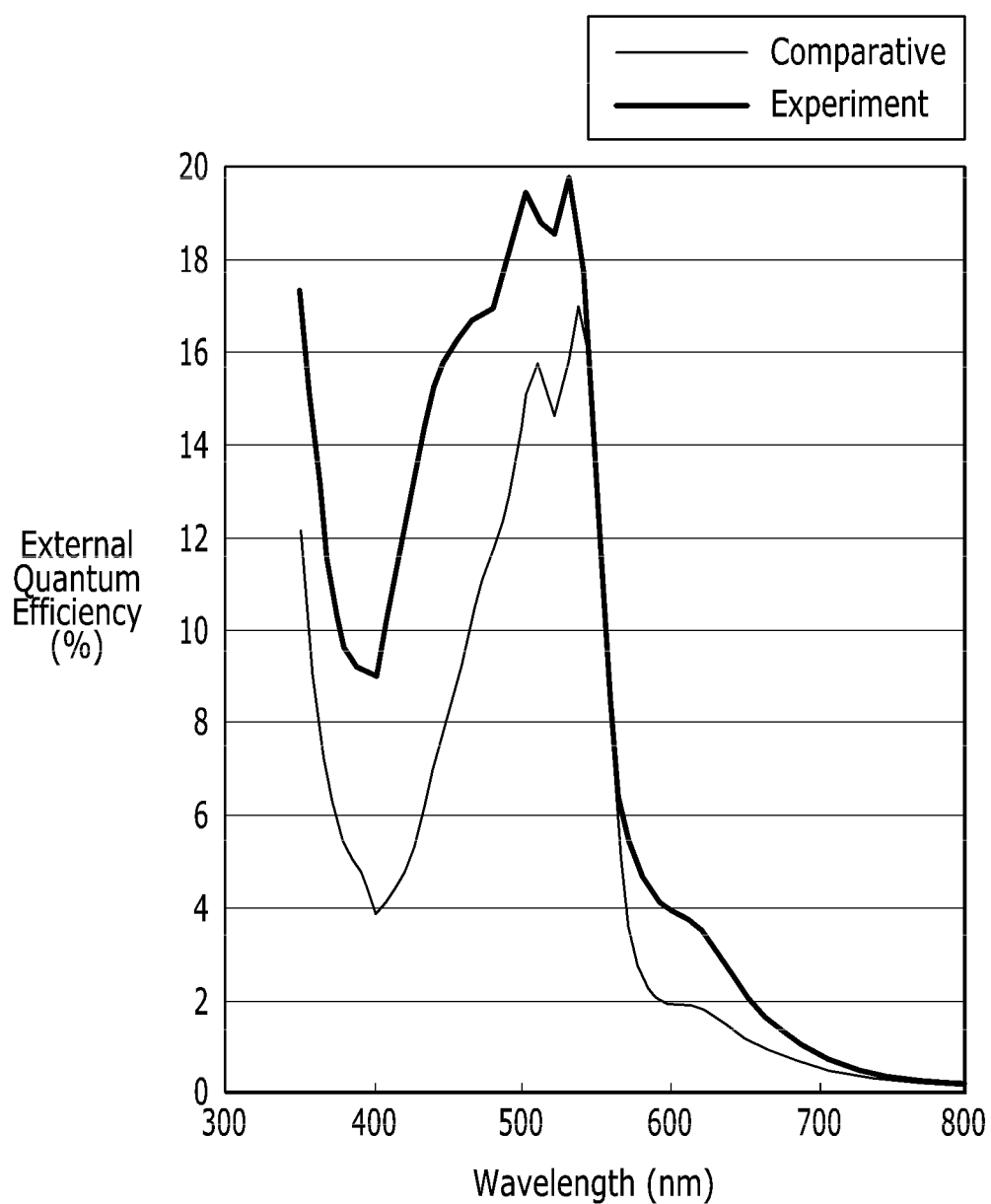
FIG. 10 is a graph showing external quantum efficiency (EQE) of the experimental and comparative examples of photodiodes as a function of wavelength of incident light.
Figure 11:
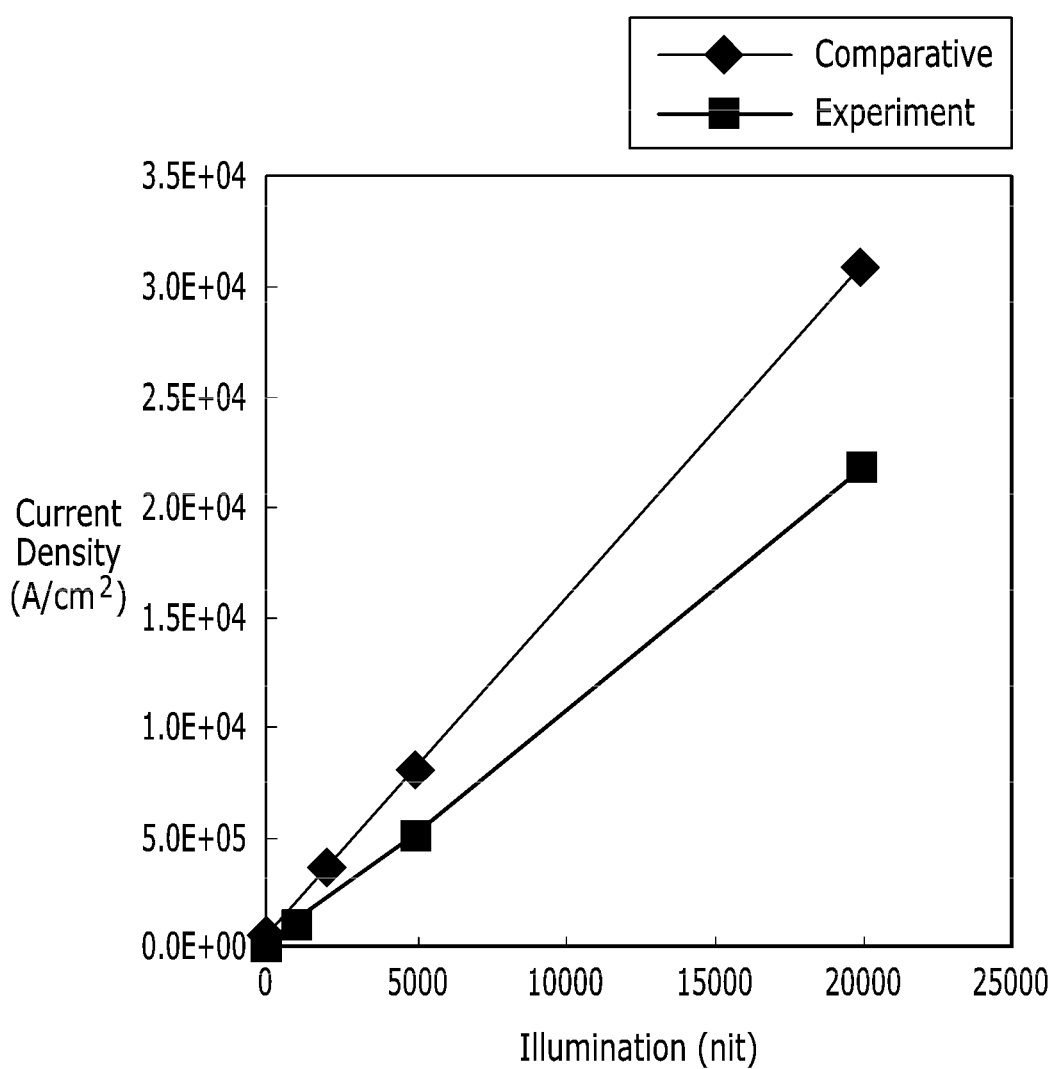
FIG. 11 is a graph showing photo current density of the experimental and comparative examples of photodiodes as a function of illumination.

Experimental and comparative examples of photodiodes are described in detail with reference to FIG. 8 to FIG. 11. FIG. 8 is a schematic sectional view of an experimental example of a photodiode according to example embodiments, FIG. 9 is a schematic sectional view of a comparative example of a photodiode, FIG. 10 is a graph showing external quantum efficiency (EQE) of the experimental and comparative examples of photodiodes as function of wavelength of incident light, and FIG. 11 is a graph showing photo current density of the experimental and comparative examples of photodiodes as function of illumination.

A photodiode 800 having a structure shown in FIG. 8 was manufactured. Referring to FIG. 8, an anode 820 having a thickness of about 100 nm was formed by sputtering ITO, and an electron blocking layer 860 of about 30 nm thickness was formed by spin-coating PEDOT:PSS.

DMQA as a P-type semiconductor and fullerene (C60) as an N-type semiconductor were co-deposited by thermal evaporation to form an intrinsic layer 810. In detail, a lower sublayer 812, an intermediate sublayer 814, and an upper sublayer 816 were deposited in sequence by varying the composition ratios of DMQA and C60. The composition ratio DMQA:C60 was about 10:1 in the lower sublayer 812, about 5:1 in the intermediate sublayer 814, and about 1:10 in the upper sublayer 816. The thicknesses of the lower sublayer 812, the intermediate sublayer 814, and the upper sublayer 816 were about 10 nm, about 30 nm, and about 10 nm, respectively. C60 was thermally deposited to form an N-type layer 840 having thickness of about 30 nm. A cathode 830 having a thickness of about 100 nm was formed by thermal evaporation of aluminum (Al).

Figure 9:
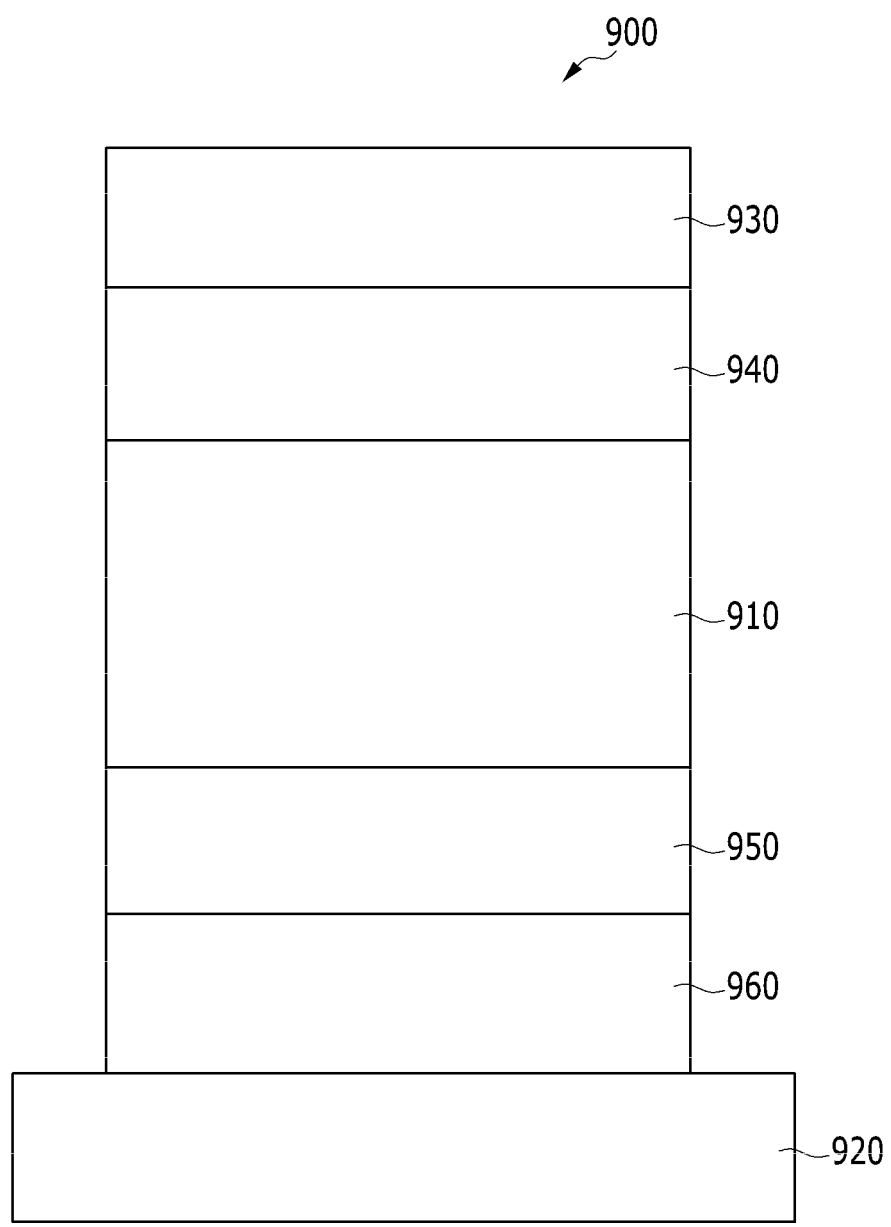
FIG. 9 is a schematic sectional view of a comparative example of a photodiode.

A photodiode 900 having a structure shown in FIG. 9 was manufactured for comparison. Referring to FIG. 9, an anode 920 having a thickness of about 100 nm was formed by sputtering ITO, and an electron blocking layer 960 of about 30 nm thickness was formed by spin-coating PEDOT:PSS.

A P-type layer 950 having a thickness of about 30 nm was formed by thermal evaporation of DMQA as a P-type semiconductor, an intrinsic layer 910 having a thickness of about 50 nm was formed by co-depositing DMQA as a P-type semiconductor and C60 as an N-type semiconductor with a composition ratio of about 5:1 by means of thermal evaporation, and an N-type layer 940 having a thickness of about 30 nm was formed by thermal evaporation of C60. A cathode 930 having a thickness of about 100 nm was formed by thermal evaporation of Al.

For the photodiodes 800 and 900 manufactured as described, external quantum efficiency (EQE) and photo responsivity were measured.

As shown in FIG. 10 that illustrates the EQE of the photodiodes as a function of wavelength of incident light, the experimental photodiode 800 has higher EQE than the comparative photodiode 900 generally. In particular, at the wavelength of about 540 nm where the EQE is the highest, the EQE of the experimental photodiode 800 is about 20%, which is greater than that of the comparative photodiode 900 by about 3%, i.e., about 17%.

As shown in FIG. 11 that illustrates photo current density of the photodiodes as a function of illumination, the responsivity of the experimental photodiode 800 is improved compared to that of the comparative photodiode 900.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A photodiode comprising:
   an anode;
   a cathode; and
   an intrinsic layer between the anode and the cathode, the intrinsic layer including lower, intermediate, and upper sublayers deposited in sequence, wherein a composition ratio of a P-type semiconductor relative to a N-type semiconductor is substantially constant throughout each of the lower, intermediate, and upper sublayers,
   wherein each sublayer of the lower, intermediate, and upper sublayers includes both of the P-type semiconductor and the N-type semiconductor,
   wherein the composition ratio of the P-type semiconductor relative to the N-type semiconductor in the lower sublayer is an inverse of the composition ratio of the P-type semiconductor relative to the N-type semiconductor in the upper sublayer,
   wherein the composition ratio of the P-type semiconductor relative to the N-type semiconductor in the intermediate sublayer is about 5:1, and
   wherein the composition ratio of the P-type semiconductor relative to the N-type semiconductor in the lower sublayer is greater than 10:1 and smaller than about 1000:1, and the composition ratio of the P-type semiconductor relative to the N-type semiconductor in the upper sublayer is smaller than 1:10 and greater than about 1:1000.

2. The photodiode of claim 1, wherein each of lower, intermediate, and upper sublayers has a thickness of about 1 nm to about 100 nm.

3. The photodiode of claim 1, further comprising:
an N-type semiconductor layer between the intrinsic layer and the cathode, the N-type semiconductor layer substantially not including the P-type semiconductor.

4. The photodiode of claim 3, further comprising:
an electron blocking layer between the intrinsic layer and the anode, the electron blocking layer including at least one of poly(3,4-ethylenedioxythiophene) poly(styrenesulfonate) (PEDOT:PSS), 4,4',4"-tris(N-(2-naphthyl)-N-phenyl-amino)-triphenylamine (2TNATA), a molybdenum oxide, and a zinc oxide.

5. The photodiode of claim 1, further comprising:
a P-type semiconductor layer between the intrinsic layer and the anode, the P-type semiconductor layer not including the N-type semiconductor.

6. The photodiode of claim 1, further comprising:
a hole blocking layer between the intrinsic layer and the cathode, the hole blocking layer including at least one of 4,7-diphenyl-1,10-phenanthroline (Bphen), Benocyclidine (BCP), and 1,3,5-tris(1-phenyl-1H-benzilnidazol-2-yl)benzene (TPBI).

* * * * *